United States Patent [19]

Kase et al.

[11] Patent Number: 4,553,054
[45] Date of Patent: Nov. 12, 1985

[54] POWER ON RESET CIRCUIT FOR MICROPROCESSOR

[75] Inventors: Kiyoshi Kase, Chiba; Masaru Fukuta, Yokohama, both of Japan

[73] Assignee: Motorola, Inc., Schaumburg, Ill.

[21] Appl. No.: 463,709

[22] Filed: Feb. 4, 1983

[51] Int. Cl.$^4$ ............................................. H03K 5/153
[52] U.S. Cl. ................................ 307/597; 307/200 B;
307/601; 307/603; 307/605
[58] Field of Search ............... 307/592, 594, 595, 596,
307/597, 200 A, 200 B, 279, 291, 601, 603, 605,
246

[56] References Cited

U.S. PATENT DOCUMENTS 4,365,174  12/1982  Kucharewski ..................... 307/594

Primary Examiner—Stanley D. Miller
Assistant Examiner—D. R. Hudspeth
Attorney, Agent, or Firm—Vincent B. Ingrassia

[57] ABSTRACT

A circuit for generating a pulse when a voltage (VDD) is applied thereto comprising an input (10) for receiving the applied voltage, an output (36), a first capacitor (16) connected to be charged from the input through a first switch (12), a second capacitor (18) connected to be charged from the first capacitor through a second switch (14), control means (34) for alternately enabling the first and second switches and switch means (20, 22, 24, 26) connected to the second capacitor for applying the applied voltage to the output when the voltage on the second capacitor is less than a predetermined value and for applying ground voltage to the output when the voltage on the second capacitor is greater than the predetermined value.

4 Claims, 2 Drawing Figures

POWER ON RESET CIRCUIT FOR MICROPROCESSOR

FIELD OF INVENTION

This invention relates to pulse generating circuits and in particular to pulse generating circuits for generating a pulse when a voltage is applied thereto.

Such circuits are commonly used as power-on reset circuits in equipment using microprocessors, the pulse generated when power to the circuit is switched on being applied to the reset input of the microprocessor to trigger the microprocessor's initialisation subroutine.

DESCRIPTION OF PRIOR ART

A known power-on reset circuit uses a single capacitor which is charged by an applied voltage at power-on and which is discharged step-wise at a predetermined rate to produce a pulse trailing edge which is used to trigger the microprocessor.

However, such a circuit operates satisfactorily only if the rise time of the applied voltage falls within an acceptable range (typically 1 us–1 ms) otherwise the voltage across the capacitor does not reach that required to generate an acceptable pulse trailing edge.

Also, when such a circuit is produced in integrated form it is difficult to control accurately the width of the generated pulse since the pulse width depends on the exact value of the capacitor and this is subject to a relatively wide variation imposed by the integrated circuit manufacturing process.

It is an object of the present invention to provide a pulse-generating circuit for generating a pulse when a voltage is applied thereto wherein the above mentioned disadvantages may be overcome or at least alleviated.

BRIEF SUMMARY OF INVENTION

In accordance with the invention a pulse generating circuit for generating a pulse when a voltage is applied thereto comprises an input for receiving an applied voltage; an output; a first capacitance to be charged from said input; first switch means coupled between said input and said first capacitance to control the charging of said first capacitance; a second capacitance larger than said first capacitance and connected to be charged from said first capacitance; a second switch means coupled between said first capacitance and said second capacitance to control the charging of said second capacitance; control means connected to said first switch means and said second switch means to enable alternately said first switch means to charge said first capacitance and second switch means to charge said second capacitance; third switch means connected to said second capacitance to apply a first predetermined voltage to said output when the voltage on said second capacitance is less than a predetermined value and to apply a second predetermined voltage different from said first predetermined voltage to said output when the voltage on said second capacitance is greater than the predetermined value. The pulse generating circuit also includes an inverter having an output coupled to the first switch means and an input; and a NOR gate having an output connected to the inverter input, a first input connected to the output of the pulse generating circuit, and a second input connected to the inverter output.

One pulse generating circuit in accordance with the invention will now be described, by way of example only, with reference the accompanying drawings, in which:

DETAILED DESCRIPTION OF EXAMPLE OF INVENTION

Figure 1:
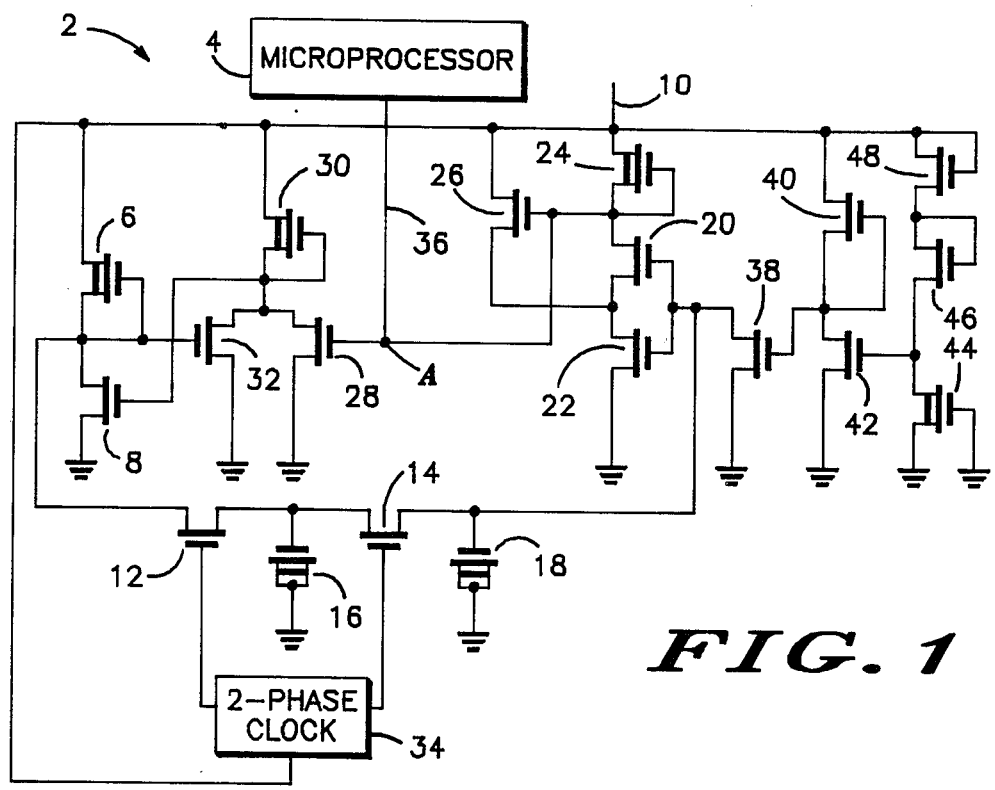
FIG. 1 shows a circuit diagram of the pulse generating circuit.

Referring to the drawings a power-on reset circuit 2 for a microprocessor 4 includes a pair of Enhancement and Depletion MOS FET series-connected transistors 6 and 8. The drain electrode of transistor 6 is connected to circuit power supply input 10 and the source electrode of transistor 8 is connected to ground. The mid-point connection of the transistors 6, 8 is connected to the gate electrode of transistor 6 and to the source electrode of a FET switch 12.

The drain electrode of transistor 12 is connected to the source electrode of a FET switch 14 and also to one electrode of a capacitor 16. The other electrode of the capacitor 16 is connected to ground. The drain electrode of transistor 14 is connected to one electrode of a capacitor 18 whose other electrode is connected to ground. The value of capacitor 18 is much greater, as will be explained below, than that of capacitor 16.

The drain electrode of transistor 14 is also connected to the gate electrodes of two series connected FET transistors 20 and 22. The source electrode of transistor 22 is connected to ground and the drain electrode of transistor 20 is connected to the source electrode of a depletion FET transistor 24. The mid-point connection of transistors 20 and 22 is connected to the source electrode of a FET transistor 26. The drain electrode of transistor 26 is connected to the drain electrode of the transistor 24 and to the circuit power supply input 10. The mid-point connection of transistors 20 and 24 is connected to the gate electrodes of transistors 24 and 26.

The mid-point connection of the transistors 20 and 24 is also connected to the gate elecrode of a FET transistor 28. The source electrode of a transistor 28 is connected to ground and the drain electrode of transistor 28 is connected to the source electrode of a depletion FET transistor 30 whose drain electrode is connected to the circuit power supply input 10. The source electrode of transistor 30 is connected to the gate electrode of the transistor and also to the drain electrode of a FET transistor 32 whose source electrode is connected to ground. The source electrode of transistor 30 is also connected to the gate electrode of transistor 8.

The gate electrodes of the transistor switches 12 and 14 are respectively connected to alternate phase outputs of a two-phase clock signal generator 34 which is typically powered from the same circuit power supply input 10. The circuit output 36 is connected to the gate electrodes of transistors 24, 26, and 28 and to the mid-point connection of transistors 20 and 24.

The gate electrodes of the transistors 20 and 22 are also connected to the drain electrode of a FET transistor 38 whose source electrode is connected to ground The gate electrode of transistor 38 is connected to the mid-connection point of a pair series-connected FET transistors 40 and 42 and to the gate electrode of transistor 40. The drain electrode of transistor 40 is connected to the circuit power supply input 10 and the source electrode of transistor 42 is connected to ground.

The gate electrode of the transistor 42 is connected to the drain electrode of a depletion FET transistor 44 whose source and gate electrodes are connected to ground. The drain electrode of the transistor 44 is connected to the source electrode of a FET transistor 46. The drain and gate electrodes of the transistor 46 are connected to the source electrode of a FET transistor 48. The drain and gate electrodes of the transistor 48 are connected to the circuit power supply input 10.

Figure 2:
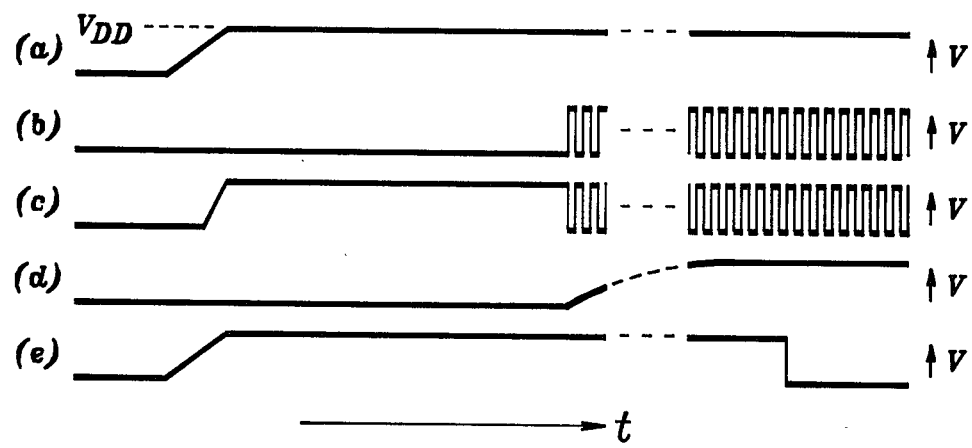
FIG. 2 shows various signal waveforms occurring in the circuit of FIG. 1.

Referring now also to FIG. 2, in operation the circuit functions as follows:

Initially, i.e., before power is applied to the circuit, the capacitors 16 and 18 are assumed to be uncharged (as will described later, capacitor 18 is rapidly discharged at power-on). When a voltage, shown in FIG. 2(a), is applied to the circuit at terminal 10, the voltage at the point A, shown in FIG. 2(e), rises with the applied voltage to its nominal value VDD, the transistor arrangement 20, 22, 24 and 26 forming a Schmitt trigger, with the transistor 24 remaining on even when its drain voltage is almost equal to its source voltage. The high voltage at the point A causes the transistor 28 to turn on. The transistor arrangement 28, 30 and 32 forms a NOR gate, the inputs to which are applied to the gate electrodes of the transistors 28 and 32 and the output of which is applied to the gate electrode of the transistor 8. This NOR gate functions in the typical manner. That is, a low voltage must appear at both inputs (the gate electrodes of transistors 28 and 32) before a high voltage will appear at the NOR gate's output (i.e. the gate electrode of transistor 8). Transistor 8 is thus prevented from turning on and the voltage VDD is applied to the source electrode of transistor switch 12, the transistors 6 and 8 forming an inverter.

When the voltage VDD is applied to the clock 34 the clock begins to generate two non-overlapping clock signals of the same predetermined frequency and having 180 phase difference. These two clock signals, shown in FIGS. 2(b) and 2(c), are respectively applied to the gate electrodes of the transistor switches 12 and 14.

When the transistor switch 12 first turns on, the transistor switch 14 is off and the capacitor 16 charges to the voltage VDD. Transistor 12 is then turned off and transistor 14 is turned on, allowing the charge on the capacitors 16 and 18 to equalise and so charging the capacitor 18 (since it is of much higher value than that of capacitor 16) to a small fraction of the voltage VDD. Transistor 14 is then turned off, holding the voltage on capacitor 18, and transistor 12 is turned on, causing the capacitor 16 to be re-charged to the voltage VDD. Transistor 12 is then turned off and transistor 14 is turned on, again equalising the charge on the capacitors and increasing the voltage on capacitor 18.

This cycle of switching of the transistors 12 and 14 continues with the voltage on capacitor 18 being cyclically "pumped-up", as shown in FIG. 2(d), towards the voltage VDD.

When the voltage reaches the trigger voltage of the Schmitt trigger (transistors 20–26), the transistor 22, which has a slightly lower threshold voltage than transistor 20, turns on and reduces the source voltage of transistor 26 to ground. Then, when the gate voltage on transistors 20 and 22 rises slightly and turns on transistor 20, the transistor 20 switches hard on and rapidly applies the ground voltage to the output 36 of the circuit. The output is maintained at ground voltage for as long as power is supplied to the circuit. As can be seen in FIG. 2(e) the voltage at the output 36 thus takes the form of a pulse having a leading edge which rises to the voltage VDD at the same rate as the applied voltage and a trailing edge which falls sharply to ground voltage when the voltage on the capacitor 18 reaches the trigger voltage of the Schmitt trigger (20–26).

The sharp trailing edge is used to trigger the reset subroutine of the microprocessor 4.

It will be appreciated that the length of duration of the output pulse is determined by the rate at which the voltage on capacitor 18 increases and that this is determined by the reaction of the capacitance values of the capacitors 18 and 16: the larger the ratio of the capacitance of capacitor 18 to that of capacitor 16, the longer will be the duration of the output pulse.

The transistors 44, 46 and 48 act as a voltage divider so that while the input voltage is applied to the circuit, the transistors 44, 46 and 48 are all turned on and a voltage near to VDD is applied to the gate electrode of transistor 42. The transistors 40 and 42 act as an inverter. Transistor 42 is thus turned on and causes the ground voltage to be applied to the gate electrode of transistor 38. Transistor 38 is thus turned off and so isolates the charge electrode of the capacitor 18 from the ground.

At power-on, i.e., when the voltage VDD is applied to the circuit, transistors 46 and 48 are initially off and transistor 44 is on. Thus transistor 42 is off and transistor 38 is on, discharging the capacitor 18. Extremely rapidly after power-on transistor 46 and 48 turn on, turning off transistor 38 as described immediately above and charging of the capacitor 16 and 18 begins as previously described.

At power-off, i.e., when the applied voltage VDD is withdrawn from the circuit, the voltage applied to the gate electrode of transistor 42 from the voltage divider 44, and 46, 48 falls towards ground voltage, and as soon as it reaches the threshold voltage of the transistor 42 turns the transistor off. The voltage applied to the gate electrode of transistor 38 from the inverter 40, 42 rises and the transistor 38 is turned on. The capacitor 18 discharges through the transistor 38 to ground.

It will be appreciated that the duration of the output pulse produced by the circuit is not affected by the rise time of the applied voltage VDD, the pulse duration being determined by the ratio of the capacitances of the capacitors 16 and 18.

It will also be appreciated that since the pulse duration is determined by the ratio of the capacitance values, the pulse duration may be controlled even when the circuit is produced in integrated circuit form. This is because although it is difficult to control the exact capacitance of a single capacitor in an integrated circuit (due to variations imposed by the integrated circuit manufacturing process), the ratio of the capacitances of two such capacitors is less affected by such variations and so is more easily controlled.

We claim:

1. A pulse generating circuit for generating a pulse when a voltage is applied thereto comprising:
   an input for receiving an applied voltage;
   an output;
   a first capacitance to be charged from said input;
   first switch means having a first end coupled to said input and a second end coupled to said first capacitance to control the charging of said first capacitance;

a second capacitance larger than said first capacitance to be charged by said first capacitance;

second switch means coupled between said first capacitance and said second capacitance to control the charging of said second capacitance;

control means connected to said first switch means and said second switch means to enable alternately said first switch means to charge said first capacitance and second switch means to charge said second capacitance;

third switch means connected to said second capacitance to apply a first predetermined voltage to said output when the voltage on said second capacitance is less than a predetermined value and to apply a second predetermined voltage different from said first predetermined voltage to said output when the voltage on said second capacitance is greater than the predetermined value;

inverter means having an output coupled to said first end of said first switch means and having an input; and NOR gate means having an output coupled to said inverter means input, a first input coupled to the output of said pulse generating circuit, and a second input coupled to said inverter means output.

2. A pulse generating circuit according to claim 1 wherein said first predetermined voltage is the applied voltage and said second predetermined voltage is ground voltage.

3. A pulse generating circuit according to claim 1 wherein said third switch means comprises Schmitt trigger means having an input coupled to said second capacitance and an output coupled to the output of said pulse generating circuit.

4. A pulse generating circuit according to claim 1 further comprising capacitance discharging means comprising:

fourth switch means connected between said second capacitance and ground;

further inverter means having an output connected to said fourth switch means to control said fourth switch means and an input; and a voltage divider connected between the input of said pulse generating circuit and ground, a predetermined point on said voltage divider being connected to the input of said further inverter means so that when the applied voltage is received at the input of said pulse generating circuit said further inverter means disables said fourth switch means and when the applied voltage is withdrawn from the input of said pulse generating circuit said further inverter means enables said fourth switch means, discharging said second capacitance.

* * * * *